United States Patent
Webber et al.

(10) Patent No.: US 10,699,038 B2
(45) Date of Patent: Jun. 30, 2020

(54) CONFIGURABLE REPRESENTATION OF DOMAIN MODELS

(71) Applicant: LITMUS BLUE, LLC, Broomfield, CO (US)

(72) Inventors: Duane Ray Webber, Broomfield, CO (US); Vitalii Stakhov, Zhitomir (UA); Thomas Damon DeGerlia, Lakewood, CO (US)

(73) Assignee: Litmus Blue Technology LLC, Broomfield, CO (US)

( * ) Notice: Subject to any disclaimer, the term of this patent is extended or adjusted under 35 U.S.C. 154(b) by 812 days.

(21) Appl. No.: 13/843,779

(22) Filed: Mar. 15, 2013

(65) Prior Publication Data

US 2013/0262055 A1    Oct. 3, 2013

Related U.S. Application Data

(60) Provisional application No. 61/618,607, filed on Mar. 30, 2012, provisional application No. 61/618,616, filed on Mar. 30, 2012, provisional application No. 61/618,617, filed on Mar. 30, 2012, provisional application No. 61/618,623, filed on Mar. 30, 2012.

(51) Int. Cl.
  *G06G 7/48*  (2006.01)
  *G06F 30/20*  (2020.01)
  *G06F 8/10*  (2018.01)

(52) U.S. Cl.
  CPC ............... *G06F 30/20* (2020.01); *G06F 8/10* (2013.01)

(58) Field of Classification Search
  CPC .. G06F 17/5009; G06F 17/10; G06F 2217/16; G06F 17/50
  USPC ................................................ 703/2, 24
  See application file for complete search history.

(56) References Cited

U.S. PATENT DOCUMENTS

| | | | |
|---|---|---|---|
| 5,918,232 A | 6/1999 | Pouschine et al. | |
| 5,991,762 A | 11/1999 | Nagarajayya et al. | |
| 6,063,128 A | 5/2000 | Bentley et al. | |
| 6,269,473 B1 | 7/2001 | Freed et al. | |
| 6,396,496 B1 | 5/2002 | Pfister et al. | |
| 6,631,497 B1 * | 10/2003 | Jamshidi | G06F 16/258 |
| | | | 715/205 |
| 6,701,485 B1 | 3/2004 | Igra et al. | |

(Continued)

FOREIGN PATENT DOCUMENTS

| WO | 2001006418 A1 | 1/2001 |
|---|---|---|
| WO | 2006055089 A1 | 5/2006 |

OTHER PUBLICATIONS

Notice Concerning Transmittal of International Preliminary Report on Patentability. International Application No. PCT/US2013/034712. dated Oct. 9, 2015. International Filing Date: Mar. 29, 2013.

(Continued)

*Primary Examiner* — Rehana Perveen
*Assistant Examiner* — Nithya J. Moll
(74) *Attorney, Agent, or Firm* — Faegre Drinker Biddle & Reath LLP

(57) ABSTRACT

A configurable application includes a domain model having one or more model entities. Representation entities provide representations of model entities and can include input definitions, output definitions, and structure definitions. Input definitions can define a grid having cells that can be bound, based on states, to various model entity attributes.

8 Claims, 11 Drawing Sheets

(56) References Cited

U.S. PATENT DOCUMENTS

| | | |
|---|---|---|
| 6,891,552 B1 | 5/2005 | Bush |
| 7,020,869 B2 | 3/2006 | Abrari et al. |
| 7,353,494 B2 | 4/2008 | Nielsen et al. |
| 7,419,969 B2 | 9/2008 | Naidu et al. |
| 7,424,668 B2 | 9/2008 | DeSpain |
| 7,577,937 B2 | 8/2009 | Henke et al. |
| 7,870,512 B2 | 1/2011 | Misovski |
| 7,926,030 B1 | 4/2011 | Harmon |
| 7,930,251 B2 | 4/2011 | Bloching et al. |
| 8,051,429 B2 | 11/2011 | Williamson et al. |
| 8,056,008 B2 | 11/2011 | Castrucci |
| 8,060,421 B1 | 11/2011 | Wang |
| 2002/0120917 A1 | 8/2002 | Abrari et al. |
| 2003/0058706 A1* | 3/2003 | Okamoto et al. ............. 365/200 |
| 2004/0181378 A1 | 9/2004 | Gilmore |
| 2004/0205711 A1 | 10/2004 | Ishimitsu et al. |
| 2004/0230559 A1 | 11/2004 | Newman et al. |
| 2005/0065824 A1* | 3/2005 | Kohan ................. G06F 19/322 |
| | | 705/3 |
| 2005/0188347 A1 | 8/2005 | Dorn et al. |
| 2006/0150169 A1 | 7/2006 | Cook et al. |
| 2006/0167778 A1 | 7/2006 | Hoffmann et al. |
| 2006/0293934 A1 | 12/2006 | Tsyganskiy et al. |
| 2008/0028288 A1 | 1/2008 | Vayssiere et al. |
| 2009/0044202 A1 | 2/2009 | Bloching et al. |
| 2009/0228436 A1 | 9/2009 | Pasumansky et al. |
| 2009/0249374 A1 | 10/2009 | Hepper et al. |
| 2009/0259683 A1 | 10/2009 | Murty |
| 2010/0262900 A1* | 10/2010 | Romatier ............... G05B 17/02 |
| | | 715/219 |
| 2010/0293449 A1* | 11/2010 | Thanu ................ G06F 17/246 |
| | | 715/217 |
| 2010/0313182 A1 | 12/2010 | Chen et al. |
| 2011/0078103 A1 | 3/2011 | Teng et al. |
| 2012/0054590 A1* | 3/2012 | Oh ................................ 715/212 |
| 2012/0131104 A1* | 5/2012 | Beaven ............. G06Q 10/0637 |
| | | 709/204 |

OTHER PUBLICATIONS

PCT/US2013/034712. Notification of Transmittal of the International Search Report and the Written Opinion of the Ineternational Searching Authority, or the Declaration. International File Date: Mar. 29, 2013. dated Sep. 13, 2013.

* cited by examiner

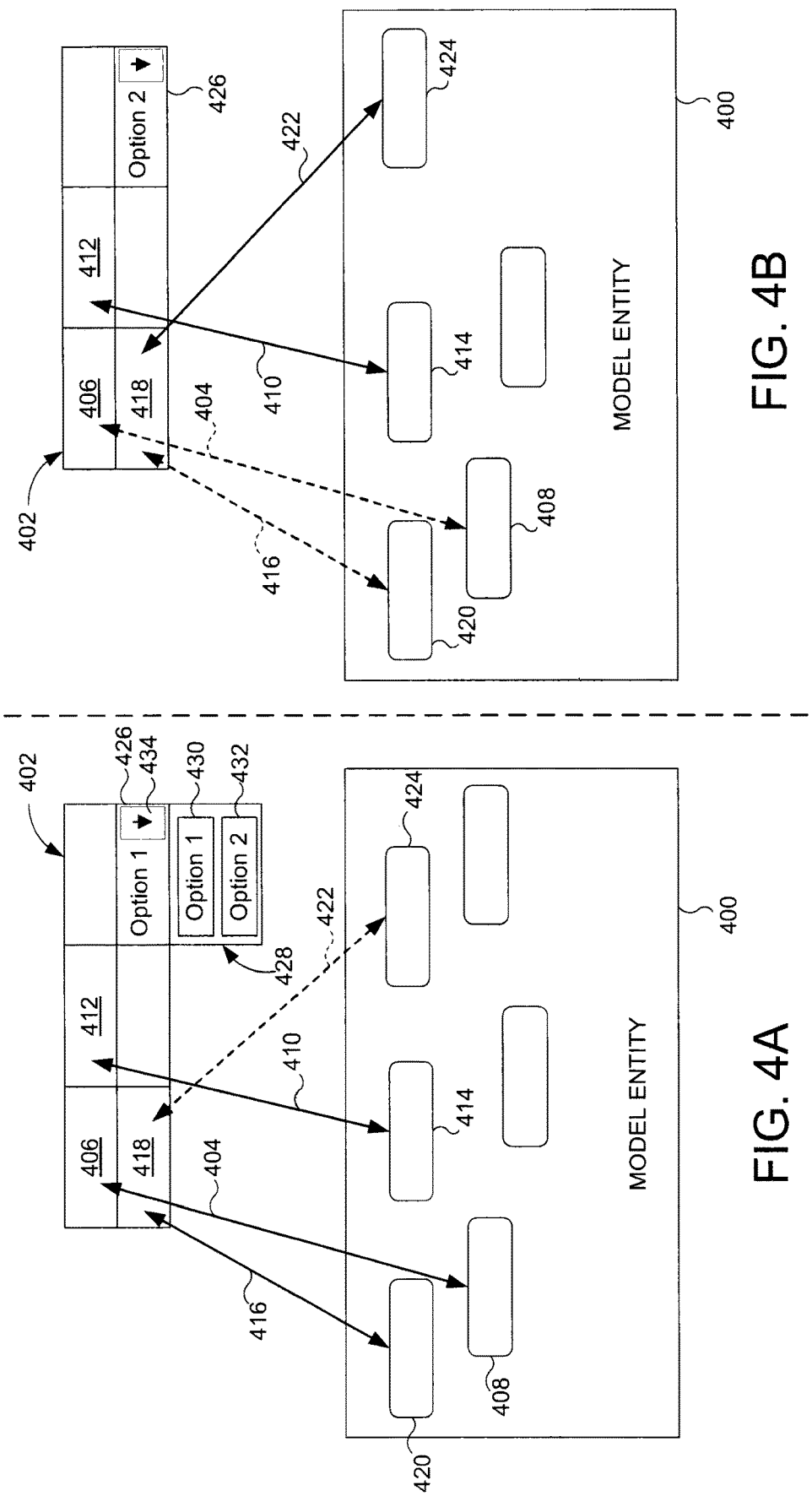

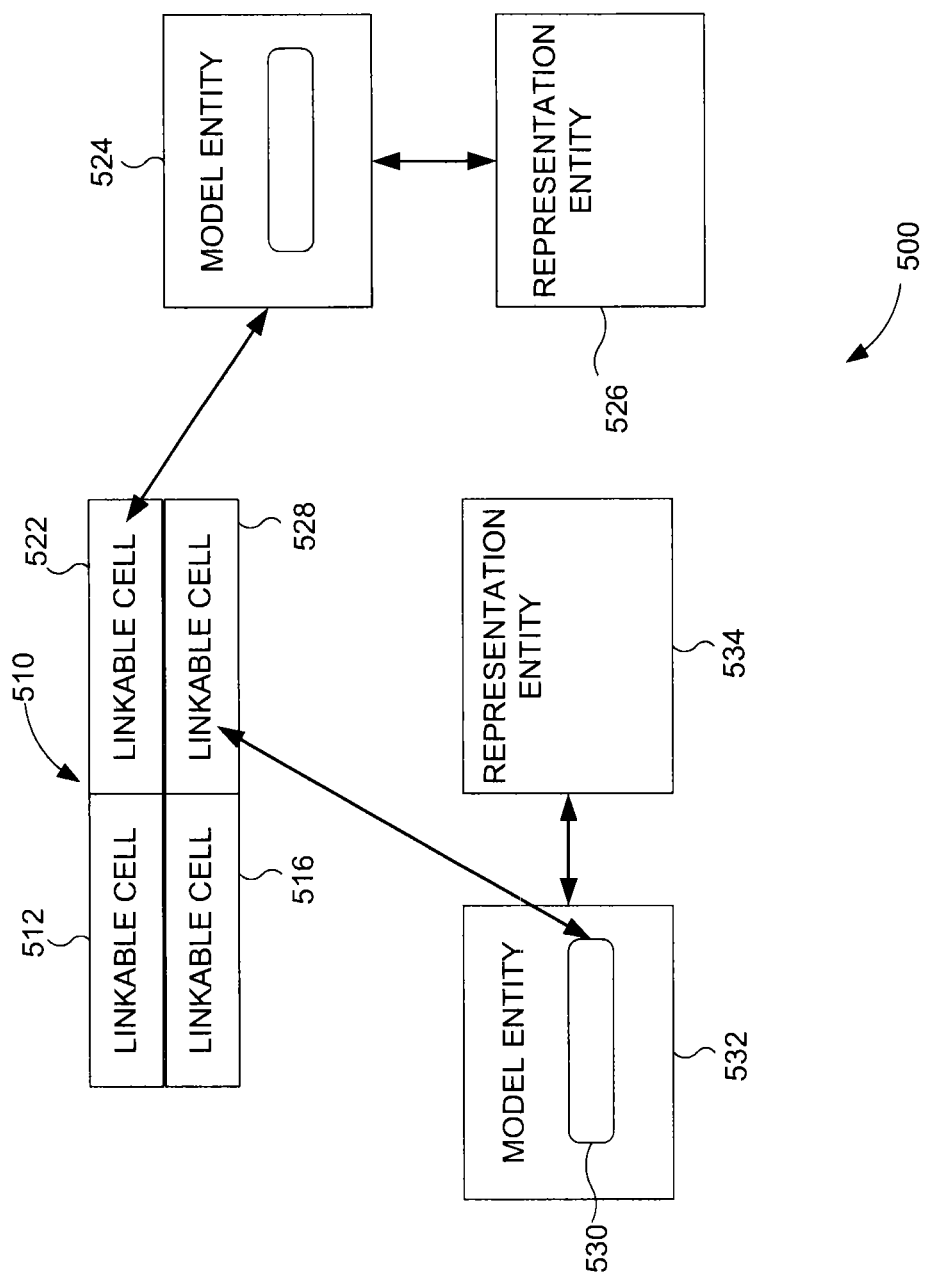

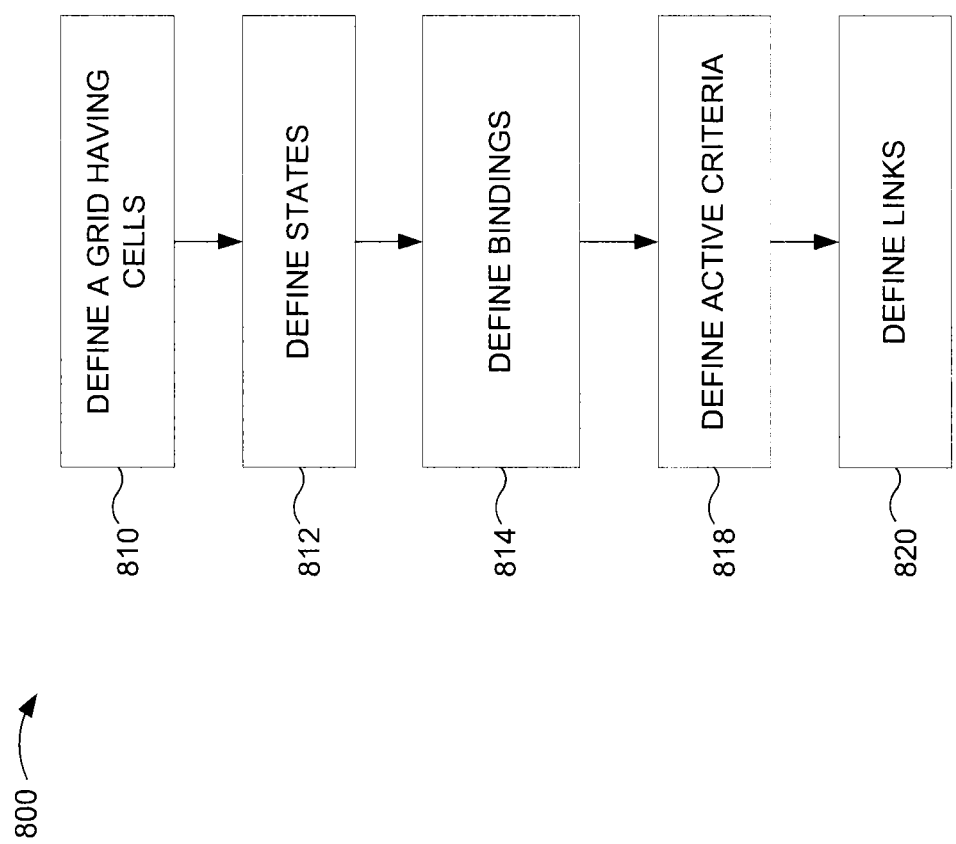

CONFIGURABLE REPRESENTATION OF DOMAIN MODELS

CROSS-REFERENCE TO RELATED APPLICATIONS

The present application claims priority to each of the following provisional applications, each of which is hereby explicitly incorporated herein, in its entirety, by reference: U.S. Provisional Application No. 61/618,607, entitled "CONFIGURABLE REPRESENTATION OF DOMAIN MODELS," filed on Mar. 30, 2012; U.S. Provisional Application No. 61/618,616, entitled "REPRESENTATION ENTITIES OF DOMAIN MODELS," filed on Mar. 30, 2012; U.S. Provisional Application No. 61/618,617, entitled "CONFIGURABLE GRID REPRESENTATION OF DOMAIN MODELS," filed on Mar. 30, 2012; and U.S. Provisional Application No. 61/618,623, entitled "COLLAPSIBLE GRID REPRESENTATION OF DOMAIN MODELS," filed on Mar. 30, 2012.

SUMMARY

Embodiments of the invention enable the creation of multiple representations of at least a portion of a domain model and/or model entities. A domain refers to a subject area to which an application is applied. A domain model refers to a system of abstractions representing aspects of a domain. Representational aspects of embodiments of the invention relate to the input, model structure, and output representation. According to embodiments, domain models and their representations can be constructed using any number of various types of programming paradigms such as, for example, object-oriented programming, functional programming, process-oriented programming, multi-paradigm programming, aspect-oriented programming, and the like.

In embodiments, a domain model includes one or more model entities, which may include attributes such as, for example, properties, values, arrays, data, enumerations, methods, algorithms, events, and the like. Aspects of a domain model are represented using representation entities, which may define how aspects of the domain model are represented, for example, via a graphical user interface (GUI) or via an application programming interface (API) to consuming code. In embodiments, representation entities may include definitions, links, states, active criteria, bindings, and the like, that can be used to present configurable representations of model entities. According to embodiments, model entities and representation entities can include objects, aspects, processes, and the like.

Embodiments of input representation aspects include configurable grid definitions, which provide views of an entity or a set of entities from an underlying domain model. Grid definitions may be used to instantiate real grids in an application when the domain view is to be part of the input. Embodiments allow a grid to be defined outside of a run-time environment and be able to be used at run-time. A grid can include a set of cells that can be organized in any number of dimensions. For example, in embodiments, a grid can be a two-dimensional set of cells organized in rows and columns, a three-dimensional set of cells organized as a cube, a four-dimensional set of cells organized as a hypercube, and the like. In embodiments, cells may also define drilldown views (e.g., "sub-views"), which can include grids, forms, or other custom input views that can be enabled for a specific cell. In embodiments, drilldown views can simplify a representation by embedding a representation inside of a grid. Additionally, in embodiments, a grid can be represented by a collapsed representation of the grid, which preserves row and column header information.

In embodiments, a cell may have one or more associated states that may define any number of behaviors including, but not limited to, i) whether the cell may contain a linkable component, ii) allowed display values from a collection of values, iii) whether the cell is active or inactive, (iv) whether the cell is read-only or read/write, v) whether the cell may be "drilled" into to display a sub-view, and/or vi) validation criteria for the cell. In embodiments, a configurable grid may allow each cell, and its state, to be individually defined, and in embodiments, groupings (e.g., rows and columns, cubes, hypercubes, and the like) of cells may be associated with a state. Additionally, in embodiments, an activation of a cell state may be triggered by one or more rules (referred to herein as "active criterion" or, in the plural, as "active criteria").

In embodiments, a cell may contain a number of states which can allow the cell to be bound to multiple domain attributes or domain entities with one state active at a time. In embodiments, a cell state may also customize available values, which may be chosen from an underlying collection of values. Embodiments of the invention allow linking strings, numeric values, model entities, model entity attributes, model entities that are of a representation entity type or types, and model entity attributes that are of a representation entity attribute type or types. In embodiments, link types can be restricted so that, for example, an inadvertent link is not created in the model at run-time. In embodiments, a cell state can be read-only or read/write. Read-only cells can be useful to indicate that a cell cannot be used as to accept input under the current model state, but may be used if the model is in a different state. In embodiments, read-only cells can also be used to present non-input information (e.g., output information, state information, status information, descriptive information, and the like).

In embodiments, a cell may be validated via validation rules. In embodiments of the invention, validation rules can be defined directly in the grid definition or tied to a set of defined business rules in code, and may affect the appearance of the grid.

Embodiments of output representations include definitions and/or descriptions of outputs of a model. Similar to input representation definitions, outputs in a representation may be selected from a number of outputs in an underlying domain model. Additionally, in embodiments, outputs may be defined in a representation alone, by using one or more attributes from the underlying domain model. For example, adding two outputs together to create a subsequent output, or transform an existing output, may be achieved in the representation.

Embodiments of model structure representations can define allowed relationships of model entities either directly or indirectly. In embodiments, model structures can include hierarchical relationships, non-hierarchical relationships, directed acyclic graphs, and the like. In embodiments, for tree-based models, this may be accomplished by defining allowed parent-child relationships for each representation entity in the model.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

FIGS. 4A and 4B depict illustrative binding aspects associated with state definitions in representation entities in accordance with embodiments of the invention;

FIG. 5 depicts examples of linking aspects in accordance with embodiments of the invention;

FIG. 8 is a flow diagram depicting an illustrative method for creating a representation of a domain model in accordance with embodiments of the invention.

Figure 1:
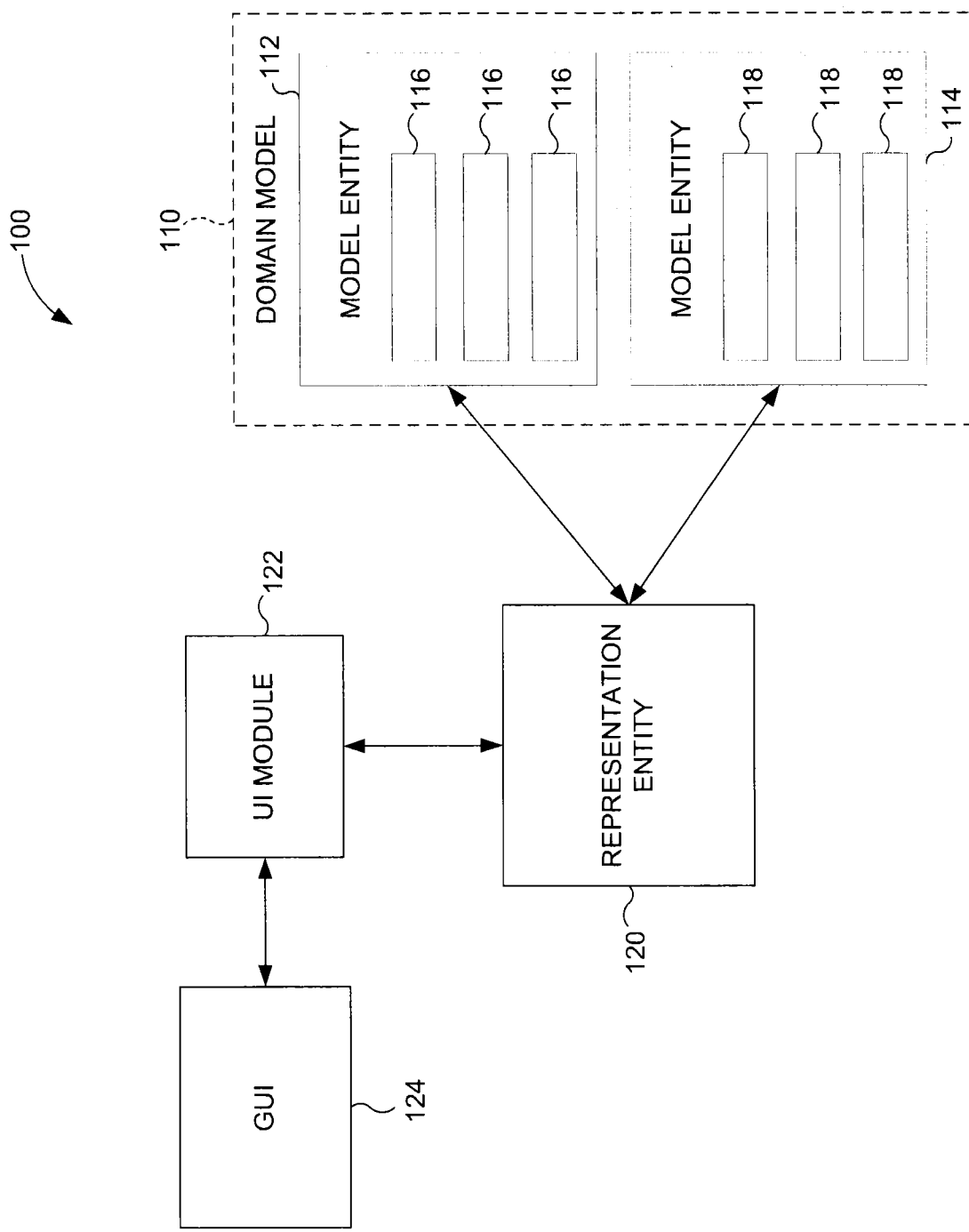
FIG. 1 depicts an illustrative conception of a configurable domain environment in accordance with embodiments of the invention.

While the invention is amenable to various modifications and alternative forms, specific embodiments have been shown by way of example in the drawings and are described in detail below. The intention, however, is not to limit the invention to the particular embodiments described. On the contrary, the invention is intended to cover all modifications, equivalents, and alternatives falling within the scope of the present disclosure.

DETAILED DESCRIPTION

FIG. 1 depicts an illustrative conception of a configurable domain environment 100 (referred to herein, interchangeably, as an "application"). In embodiments, the environment 100 can be, for example, packaged as an application or service, as part of an application or service, or the like. The illustrative domain environment 100 shown in FIG. 1 is not intended to suggest any limitation as to the scope of use or functionality of embodiments of the inventions disclosed throughout this document. Neither should the illustrative domain environment 100 be interpreted as having any dependency or requirement related to any single component or combination of components illustrated therein. Additionally, any one or more of the components depicted in FIG. 1 can be, in embodiments, integrated with various ones of the other components depicted therein (or components not illustrated). Any number of other components or combinations of components can be integrated with the illustrative domain environment 100 depicted in FIG. 1, all of which are considered to be within the scope of the invention.

As illustrated, the environment 100 includes a domain model 110 that includes one or more model entities 112 and 114. Model entities 112 and 114 can include any type of entities that can be used in the context of domain modeling and may include code written in a coding language such as, for example, C, C++, C#, Java, Ruby, or the like. Model entities 112 and 114 can include entity attributes 116 and 118. Examples of entity attributes include aspects of state (e.g., attributes, variables, definitions, properties), behavior (e.g., methods, functions, algorithms, relations, events, event-handlers), and the like. Each of the model entities 112 and 114 can include any number of entity attributes 116 and 118, respectively. In embodiments, one or more model entities 112 and 114 are combined to create the domain model 110. According to embodiments, the domain model 110 can be used to model any number of different types of domain-based problems and perform any number of different types of domain-based tasks. Examples of such tasks include financial modeling, investment decision modeling, engineering modeling, performing numerical approximation to complex systems of equations, and the like.

To facilitate a clear illustration of various aspects of embodiments of the invention, a simple modeling problem involving the configuration of fruit baskets will be discussed throughout this disclosure. For example, a domain environment in accordance with embodiments of the invention may be used to configure a "fruit basket" domain model consisting of a fruit basket model entity and different fruit model entities (e.g. an apple model entity, an orange model entity, and a banana model entity), which may have various arbitrary attributes (e.g., properties, methods, relations, events, functions, methods, conditions, and the like) related to color, size, placement, or types of fruit to be included, relationships and/or interactions between model entities, and the like.

With continued reference to FIG. 1, the illustrative domain environment 100 includes a representation entity 120 that provides a representation of one or more of the model entities 112 and 114. In embodiments, the domain environment 100 can include any number of representation entities 120. The representation entity 120 may interact with a user interface (UI) module 122 to present aspects of the domain model and/or model entity on a graphical user interface (GUI) 124 on a display device (not shown). Additionally, the representation entity 120 may be used with a model entity 112 and/or 114 directly, via code for example, to present aspects of the model entity 112 and/or 114 that may be exposed. In embodiments, representation entities 120 can be created via programming code or in XML, JSON, or other formats and can be used or configured to create a desired representation or experience of the underlying domain model 110. For example, in embodiments, representation entities 120 can be defined, outside of run-time, to include all of the definitions, rules, and criteria used for selectively exposing attributes that are relevant to a particular task or representation of the domain model 110. According to embodiments, this can simplify the representation of domain model 110, allow re-use of model entities and domain models, and allow multiple representations of a domain model and/or its model entities.

Figure 2A:
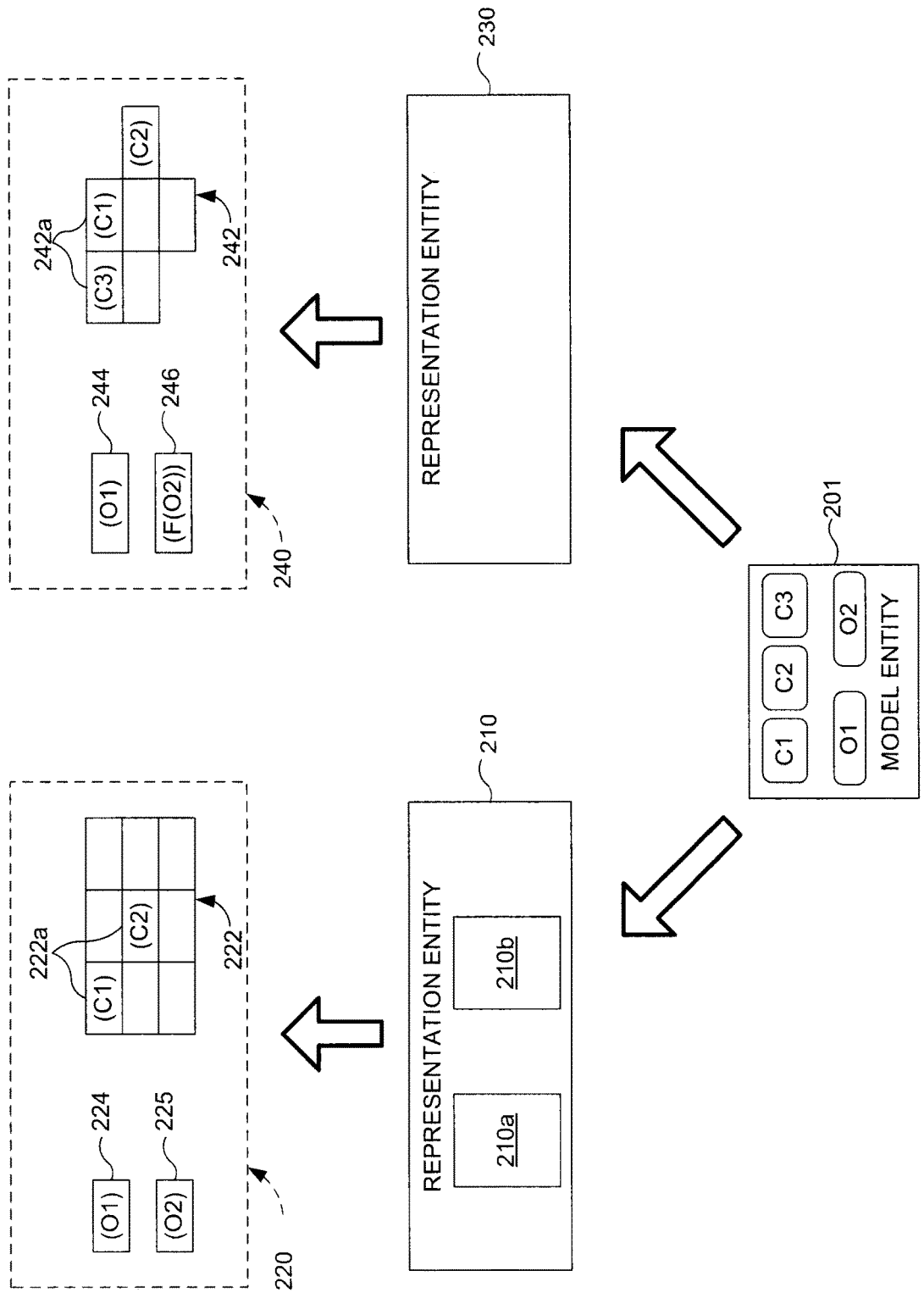
FIGS. 2A, 2B, and 2C illustrate representation aspects associated with representation entities in accordance with embodiments of the invention.
Figure 2B:
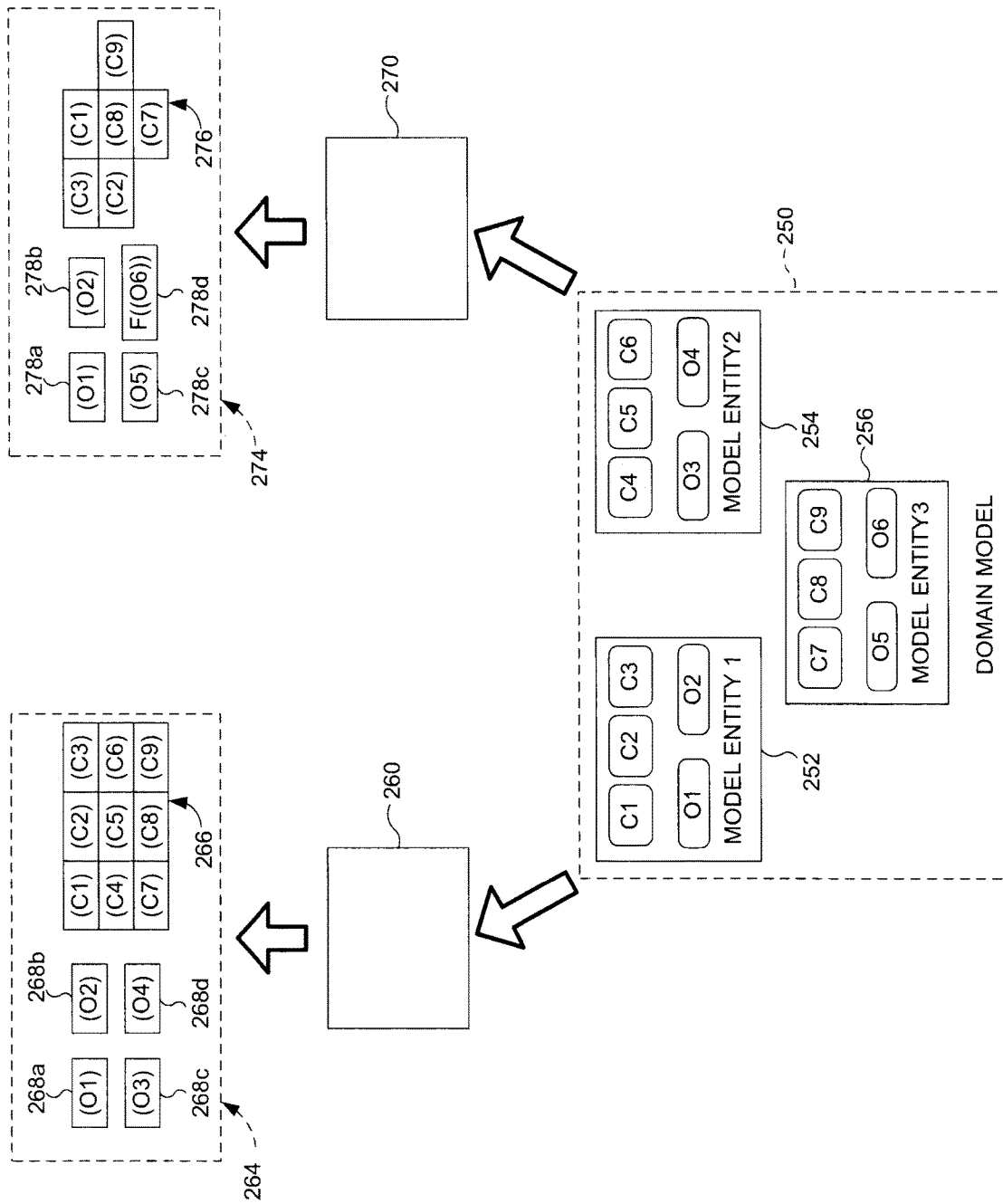
Figure 2C:
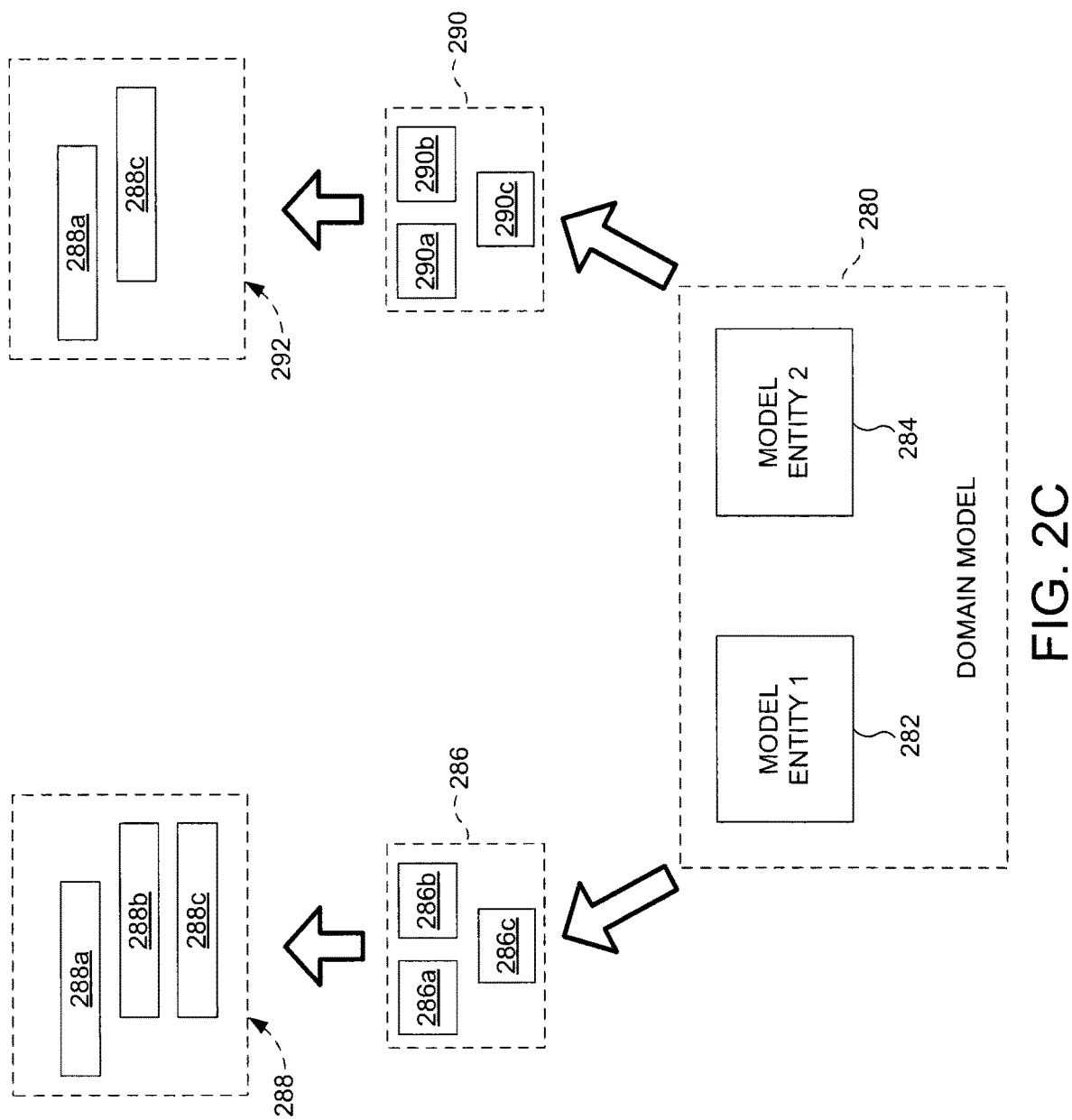

As introduced above, a representation entity can be used to provide a representation of a model entity (or entities). The representation can include, for example, a representation of model entity inputs, outputs, and domain model structure. FIGS. 2A, 2B, and 2C illustrate representation aspects associated with representation entities in accordance with embodiments of the invention. FIG. 2A shows two representation entities 210 and 230 based on the same model entity 201. The model entity 201 may include a number of entity attributes. In the illustrated embodiments, for example, model entity 201 includes model entity input attributes C1, C2, and C3 and model output attributes O1 and O2.

The representation entity 210 provides a representation 220 (e.g., via a GUI or an API) of the model entity 201. The representation 220, which can be rendered in a GUI (e.g., GUI 124 depicted in FIG. 1) on a display device, can include a grid 222 and outputs 224 and 225. It should be understood that output definition 210b can also include additional features that may control the presentation of outputs such as state definitions, active criteria, and the like. Based on the type of application, and therefore, in embodiments, particular active states, settings, and the like, the representation entity 210 defines the grid 222 by exposing various model entity attributes and/or by defining the appearance of the grid 222. For example, in FIG. 2A, model entity 201 is instantiated and representation entity 210 defines bindings that bind to model entity attributes (e.g., C1 and C2) using grid cells 222a. In this example, representation entity 210 excludes input attribute C3 from the representation perhaps, for example, because input attribute C3 is not used in the representation 240.

Also, as shown in FIG. 2A, representation entity 210 defines outputs 224 and 225 that may be displayed. In embodiments, the outputs 224 and 225 can represent a selection of model entity 201 output attributes (e.g., O1, and O2), and can be selected, for example, based on the type of application, and therefore, in embodiments, based on particular active states, rules, settings, and the like. Additionally, as introduced above, representation entity 210 may define an appearance of outputs 224 and 225. In embodiments, representation entity 210 can include active criteria or rules that provide for activation/deactivation of various states defined in the representation entity 210, which determine the representations 224 and 225 of output attributes. According to embodiments, the representation entity 210 can also include report definitions that facilitate providing output reports (not shown), which may be based on various states, rules, settings, and the like.

In FIG. 2A, representation entity 230 may define a different representation 240 (than that of representation entity 210) of inputs and outputs corresponding to the same underlying model entity 201. As illustrated, for example, representation 240 includes a grid 242 (which may include, as shown for example, a different arrangement of grid cells 242a) and outputs 244 and 246. For instance, in the fruit basket example, model entity 201 might be an apple model entity. Representation entity 210 might be a Fuji representation of apple model entity 201 whereas representation entity 230 might be a red delicious representation of apple model entity 201. In the illustrated example, the representation 246 of output attribute O2 is a function of the model entity output attribute O2. That is, in embodiments, a representation entity can include a definition of an output (e.g., (F(O2))) that facilitates providing an output that is based on a model entity output attribute. For example, a representation entity can include a formula that calculates an output, taking as input a model entity output attribute, whether that model entity output attribute is contained in the model entity, or model entities, associated with the representation entity, or another model entity attribute. Additionally, in embodiments, the representation entity can transform model entity output attributes, define which graphical depictions of model entity output attributes are available, and the like. In embodiments, Representation entity attributes defined in a representation entity may be stored or maintained in an underlying domain model via one or more model entities or model entity attributes.

For a particular representation utilizing a domain model, any number of different combinations of model entities and/or model entity attributes may be instantiated or exposed, while others may not be instantiated or exposed (e.g., some representations may not utilize particular entities). According to embodiments, in order to provide these different representations, different representation entities can be used. In this manner, a representation of a domain model can be redefined to perform different functions, have different appearances, and the like, by replacing, for example, a first representation entity, or a first set of representation entities, with another representation entity, or another set of representation entities. In embodiments, a representation entity can be modified to create a different representation entity. Additionally, in embodiments, a single representation entity (or set of representation entities) can be used to produce different representations such as, for example, by activating/deactivating different states, links, bindings, or the like.

FIG. 2B illustrates an example of how a representation entity, or a set of representation entities, can be used to provide two different representations of the same domain model 250, in accordance with embodiments of the invention. For example, as illustrated, domain model 250 includes a number of model entities 252, 254, and 256 (named, in this example, as "Model Entity 1," "Model Entity 2," and "Model Entity 3," respectively). These model entities 252, 254, and 256 (or various attributes thereof) may be included or excluded in various different representations. For example, while representation entity 260 includes model entities 252, 254, and 256 in providing representation 264, representation entity 270 includes only model entities 252 and 256 in providing representation 274. In embodiments, representations 264 and 274 may be provided by two different representation entities, two different sets of representation entities, or the like.

Additionally, representation entities may define one or more relationships among model entities within a domain model. A set of relationships among model entities is referred to herein as a domain model structure, and a representation of a domain model structure is referred to herein as a representation structure. In embodiments, such run-time relationships and/or representations may be defined directly or indirectly such as, for example, by using definitions in one or more representation entities. Defining a domain model structure indirectly may be useful, for example, in models in which relationship definitions can be contained within the representation entities themselves. An example of this is a tree structure in which each representation entity can define a model entity's allowed children. In embodiments, other types of domain model structures and/or representation structures may be defined directly using one or more representation entities that define relationships among a number of model entities, as represented by representation entities.

In an embodiment, for example, as shown in FIG. 2C, a domain model 280 (e.g., a fruit basket configuration model) includes model entities 282 and 284. For instance, model entity 282 may be a fruit basket model entity and model entity 284 may be an apple model entity. A set 286 of representation entities 286a, 286b, and 286c, define a first domain model structure, which is represented by representation structure 288. A set 290 of representation entities 290a, 290b, and 290c, define a second domain model structure, which is represented by representation structure 292. For instance, representation entities 286a and 290a may correspond to fruit basket representations, representation entities 286b and 290b may correspond to red delicious apple representations, and representation entities 286c and 290c may correspond to Fuji apple representations. The representation structure 288 may be provided to represent a first domain model structure, which may be defined indirectly via allowed parent-child relationships defined within each representation entity 286a, 286b, and 286c. For example, as shown, representation structure 288 may be a tree having a parent node 288a that corresponds to the fruit basket representation and two allowed child nodes 288b and 288c that correspond to red delicious and Fuji apple representations, respectively. Representation entity 290a may define the Fuji apple representation as its only allowed child type, thereby resulting in the representation structure 292 that includes only one child node 288c, which corresponds to the Fuji apple representation.

In embodiments, a representation structure definition can include any number of different types of functionality that may enable configuration of an instance of a domain model structure by, for example, defining an allowed model entity via a representation entity, instantiating a default model entity via a representation entity, searching for a representation entity type (e.g., as applied to model entities) within the structure, and the like. Embodiments of the invention allow access to a set of available views (e.g., representations) of a model entity. For example, in embodiments, a set of view options can be provided (e.g., via a drop-down menu) that correspond to a selected model entity in the structure.

With reference to FIG. 2A, representation entity 210 includes a definition 210a of a grid 222, which can include any number of grid cells 222a. As shown, representation entity 210 also includes a definition 210b of outputs 224 and 225. Similarly, representation entity 230 can include inputs and outputs definitions, as well, and representation entities 210 and 230 can include any number of other features in addition to, or in lieu of, the features illustrated in FIG. 2A. In embodiments, the definition 210a can specify a layout of cells 222a. In embodiments, the representation entity 210 can include a number of definitions 210a that define any number of different grids 222. For example, in embodiments, representation entity 210 can define a first grid 222 that is presented in a representation 220 and underlying grids that can be accessed, for example, through a drilldown functionality defined on a cell 222a (as discussed below, with reference to FIG. 3). In embodiments, a grid 222 may be organized having particular conceptualizations (referred to herein as "representation properties") represented by one or more rows of a grid 222, while various attributes of the representation properties can be described by columns of the grid 222. It should be understood that the description of representation properties and columns is merely one example of any number of possible types of organizations of representations. Examples of other types of representation organizations can include, but are not limited to, cubes, hypercubes, graphs, and the like.

In embodiments, grid definitions 210a (and, in embodiments, any number of other definitions or attributes included in representation entities) can define states, active criteria, links, bindings, validation criteria (which can be used to test the validity of various cells, links, bindings, and the like, without having to feed test data into the domain model), defaults (e.g., default cell values, default bindings, default links, and the like), and the like. Any number of different types of states can be defined on (e.g., corresponding to) a cell. In embodiments, each cell, and its state, can be individually defined, and in embodiments, groupings (e.g., rows and columns, cubes, hypercubes, and the like) of cells may be defined in one or more states. A state can, for example, define a behavioral attribute. Such behavioral attributes can include, for example, whether a cell (or group of cells) is active or inactive, a set of allowed display values associated with a bound value set, whether a cell (or group of cells) is read-only or read/write, whether a cell (or group of cells) is linkable, one or more validation criterion associated with a cell (or group of cells), whether a binding, link, and/or drilldown is active or inactive, and the like. In this manner, states can be used to provide dynamic functionality based on events, model entity states, domain model states, and the like. States, cells, groups of cells, bindings, links, drilldowns, and the like, can be activated and deactivated according to active criteria.

Figure 3:
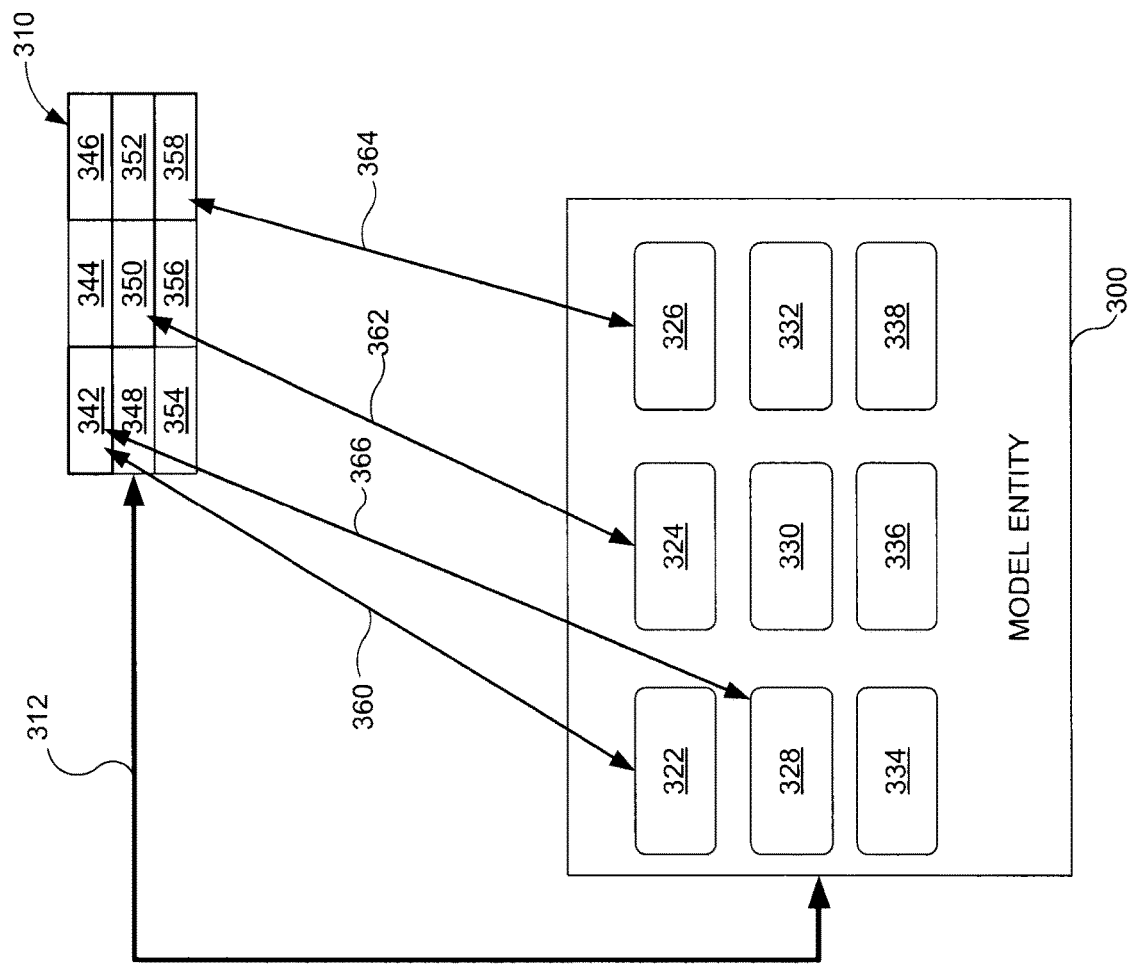
FIG. 3 is a schematic block diagram depicting aspects of input representation provided by representation entities in accordance with embodiments of the invention.

FIG. 3 is a schematic block diagram depicting aspects of input representation provided by representation entities in accordance with embodiments of the invention. As shown, a model entity 300 can include a number of different model entity attributes 322, 324, 326, 328, 330, 332, 334, 336, and 338. A grid binding 312 can be defined between a grid 310 and the model entity 300. For example, in embodiments, a representation entity (not shown in FIG. 3), can define the grid binding 312. In embodiments, the grid binding 312 can be active or inactive based on a state which may be determined based on one or more active criteria. In some embodiments, a grid 310 can be directly bound (e.g., via grid binding 312) to a model entity 300 while, in other embodiments, the grid binding 312 can be indirect. For example, in embodiments, the grid binding 312 can bind the grid 310 to an intermediary construct (e.g., a transfer object or entity, a translation component, a network service component, a deduplication component, and the like), which can be bound to, or in effect, alter the state of, the model entity 300. According to embodiments, whether the grid binding 312 is direct or indirect, the grid binding 312 can allow for changes applied at the representation level (e.g., via the grid 310) to affect one or more states of the model entity 300.

In embodiments, one or more cell bindings may be defined (e.g., by a representation entity). In embodiments, a cell binding can bind a grid cell to a model entity or model entity attribute. As depicted in FIG. 3, a first cell binding 360 binds a cell 342 to an entity attribute 322, a second cell binding 362 binds a cell 350 to an entity attribute 324, and a third cell binding 364 binds a cell 358 to an entity attribute 326. It should be understood that, in the context of embodiments of the invention, a binding can be created between a representation (e.g., a grid cell) and one (e.g., via a single state definition) or more (e.g., via multiple state definitions) model entities or model entity attributes. Additionally, in embodiments, cell bindings may bind a grid cell to more than one model entity or model entity attribute. For example, FIG. 3 depicts a cell binding 366 that binds the cell 342 to an entity attribute 328, which may be in addition to the binding 360 that binds the cell 342 to the entity attribute 322.

FIGS. 4A and 4B depict illustrative binding aspects associated with state definitions in representation entities in accordance with embodiments of the invention. In FIGS. 4A and 4B, a model entity 400 is represented, via a representation entity (not shown), by a grid 402. As illustrated, a cell binding 404 binds a cell 406 to a model entity attribute 408. A cell binding 410 binds a cell 412 to a model entity attribute 414. A cell binding 416 binds a cell 418 to a model entity attribute 420 and an additional cell binding 422 binds the cell 418 to another model entity attribute 424. A cell 426 includes an enumeration 428 of a number of options 430 and 432, which may, for example, correspond to different domain tasks facilitated by the model entity 400. In embodiments, a button 434 can be provided that, when selected, causes the enumeration 428 to be displayed, allowing selection of the model 430 or 432. In some embodiments, the grid 402 might not include an enumeration 428.

In FIG. 4A, "Option 1" has been selected. As a result of the "Option 1" being selected, one or more active criteria corresponding to the cell 418 causes one or more states to be activated or deactivated based on the selection. For example, in FIG. 4A, as a result of selection of "Option 1", an active criterion corresponding to the cell 418 causes the binding 416 to be active and another active criterion (or, in embodiments, the same active criterion) causes the binding 422 to be inactive. In FIG. 4B, "Option 2" has been selected and, as a result, the active criteria causes binding 416 to be inactive and binding 422 to be active. Whether bindings 416 and 422 are active may be determined, in embodiments, according to an active criterion that is triggered by something other than selection of a member of an enumeration 428 (e.g., a model entity or domain model being in a particular state, an event, and the like).

For instance, in the fruit basket example, the model entity 400 might be an "apple" entity and a property of the apple represented by the grid 402 might be the sweetness of the apple. The state, for example, may correspond to the units (e.g., variables) upon which a determination of the sweetness is based. Thus, for example, a first state may correspond to an expression of sweetness as a function of sunlight exposure (e.g., relating to the effect that exposure to sunlight has upon the sweetness) and a second state might correspond to an expression of sweetness as a function of humidity exposure (e.g., relating to the effect that exposure to humidity has upon the sweetness).

In embodiments, links can be defined according to types of linkable components (e.g., model entities, model entity attributes, model entities that are of a representation entity type or types, and/or model entity attributes that are included in a representation entity type or types, and the like). In embodiments, a link to a linkable component may cause the linkable component to become a part of a calculation chain associated with, or otherwise establish a relationship with, the domain model. In embodiments, a representation entity may include definitions that specify that a particular cell can only be linked to a particular entity type, attribute type, or the like. In embodiments, link types can be defined at the model entity level, representation entity level, model entity attribute level, and/or representation entity attribute level. For example, in the above example, a model entity attribute may be bound to an apple model entity and, using representation entities, links can be further restricted to types of Fuji, Granny Smith, or both.

FIG. 5 depicts examples of such linking aspects in accordance with embodiments of the invention. In embodiments, a state can be defined on a cell that allows the cell to be linkable. Additionally, in embodiments, the types of components to which the cell can be linked ("linkable components") can also be defined in the representation entity (e.g., using states, explicit definitions, and/or the like). In embodiments, allowable bindings can be defined between the linkable cells and the linkable components. The cell can then be bound to linkable component such as, for example, a model entity (e.g., an Apple entity), a model entity attribute (e.g., a property defined on an Apple model entity), a model entity that is of a representation entity type (e.g., a Fuji entity), or a model entity attribute that is defined in a representation entity type (e.g., a property defined in the Fuji entity). As shown in FIG. 5, a grid 510 includes a cell 522 that is linked to a model entity 524 (which is represented by a representation entity 526), and a cell 528 that is linked to a model entity attribute 530 of a model entity 532 (which is represented by a representation entity 534).

In embodiments, a collapsed representation of a grid 222 may also be defined. For example, using a collapsed representation, a set of rows and columns can be represented in a single row, while preserving row and column identifiers in column headers associated with the columns. In this manner, the representation (e.g., grid) can be collapsed without losing information used to completely identify a specific cell using the same nomenclature that would be used to identify the same cell in a non-collapsed representation. In embodiments, nomenclature consistency may be useful for functional aspects of domain models such as identifying a link or a path to a cell. Collapsed representations can be used, in embodiments, to represent multiple model entities, composite model entities, and the like in the same grid.

According to embodiments, collapsed representations can also be used to provide filter views, which can include a set (which may include all or a subset) of related model entities, or of related model entities of a particular representation entity type or types, and which can allow for creation or editing of numerous model entities, or numerous model entities of a representation entity type or types, in a single view. For example, an apple filter view may be selected from a fruit basket entity, causing a collapsed representation of attributes related to all of the available apple types, or specific apple types. In embodiments, filter views can correspond to model entities, representation entities, and the like.

Figure 6A:
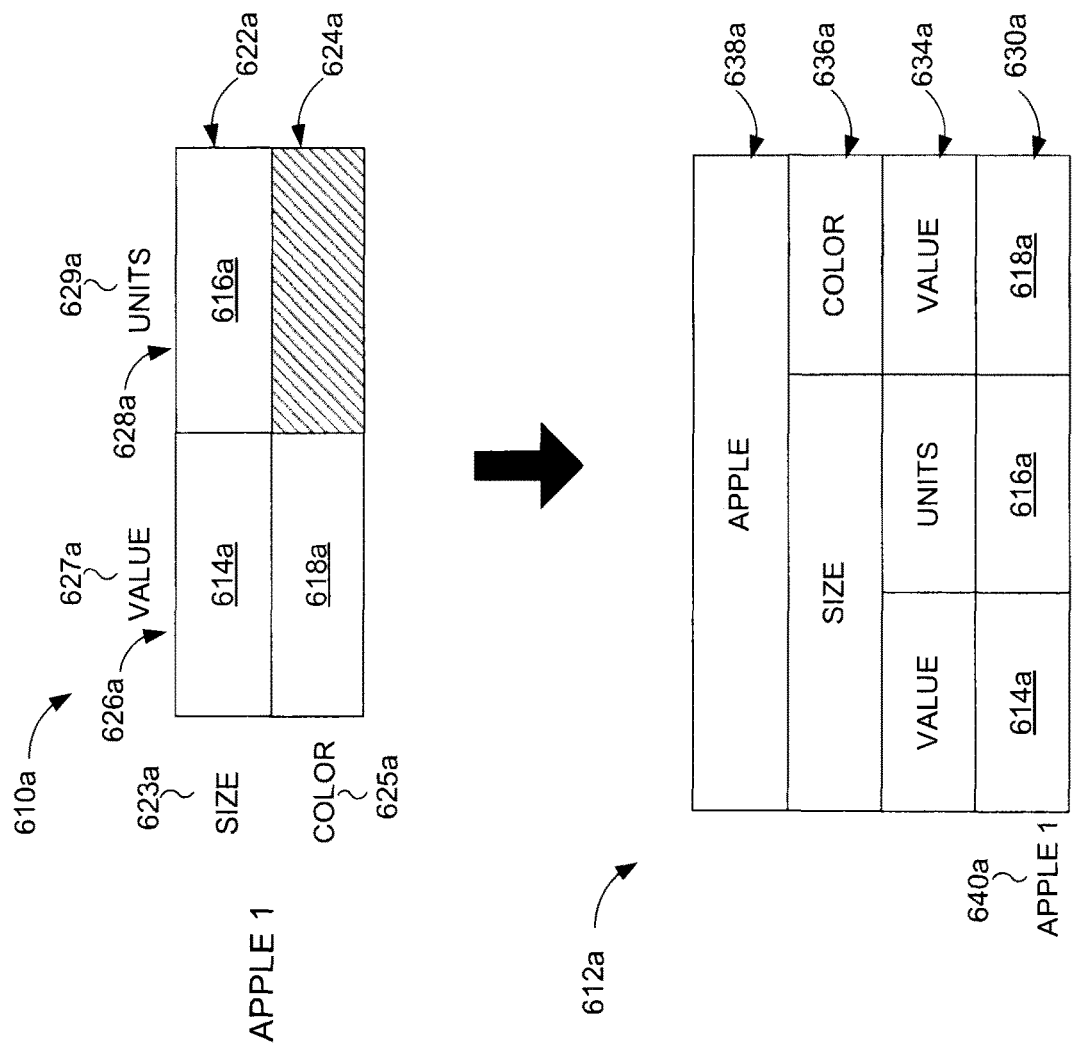
FIGS. 6A and 6B illustrate examples of collapsing grids in accordance with embodiments of the invention.
Figure 6B:
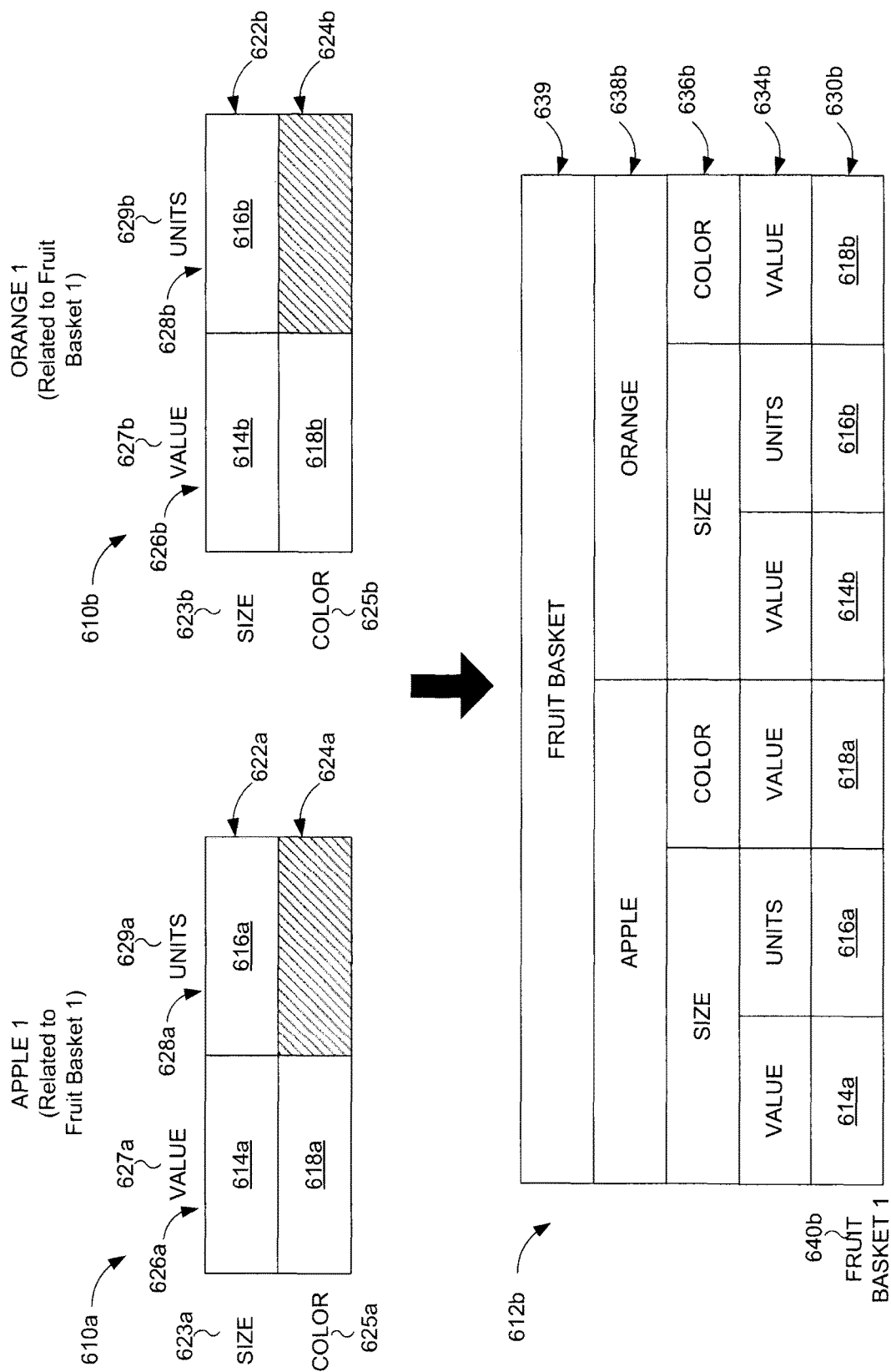

FIGS. 6A and 6B illustrate examples of collapsing grids in accordance with embodiments of the invention. For instance, in the fruit basket example, grid 610a may be used to provide inputs to an apple model entity ("Apple 1") and may include a representation property 622a related to the size of the apple, identified by a row header 623a; a representation property 624a related to a color of the apple, identified by a row header 625a; a value column 626a (e.g., magnitude of some measurement of size, indication of color, and/or the like), identified by a column header 627a; and a units column 628a (e.g., units in which the magnitude is expressed such as cubic centimeters, cubic inches, and the like), also identified by a column header 628a. Because color, in this example, may be expressed with a single, independent word or phrase, the units column 628a may not be active for the color property 624a. However, in other embodiments, color may be expressed in other ways (e.g., related to pixel counts or densities, intensities, saturations, and/or the like) and may include a units column.

Thus, the grid 610a may include input cells 614a, 616a, and 618a. A grid 612a can be defined to collapse the representation of grid 610a without losing information (e.g., information represented in the cells, the column headers, and the like). As shown, the grid 612a includes one row 630a of input cells 614a, 616a, and 618a. Additionally, the grid 612a preserves the column headers 627a and 629a in a header row 634a and the row headers 623a and 625a in a higher-level header row 636a. Additionally, the grid 612a can include a higher-level header row 638a that includes a header identifying the associated model entity and may, in embodiments, include a row header 640a identifying the associated model entity as represented by a particular representation entity.

Similarly, as shown in FIG. 6B, grid 610b may be used, for example, to provide inputs to an orange model entity (e.g., as represented by an "Orange 1" representation entity) and may include a representation property 622b related to the size of the orange, identified by a row header 623b; a representation property 624b related to a color of the orange, identified by a row header 625b; a value column 626b (e.g., magnitude of some measurement of size, indication of color, and/or the like), identified by a column header 627b; and a units column 628b (e.g., units in which the magnitude is expressed such as cubic centimeters, cubic inches, or the like), also identified by a column header 629b.

A grid 612b can be defined to collapse the representation of grids 610a and 610b without losing information, in which, for example, the apple and orange representation entities may be related or allowed related entities of fruit basket model entities. In embodiments, the apple and orange representation may be included within one or more fruit basket model entities. As shown, the grid 612*b* includes one row 630*b* of input cells 614*a*, 616*a*, 618*a*, 614*b*, 616*b*, and 618*b* and preserves the column headers 627*a*, 627*b*, 629*a*, and 629*b* in a header row 634*b*. The grid 612*b* also preserves the row headers 623*a*, 625*a*, 623*b*, and 625*b* in a higher-level header row 636*b*. In the illustrated example, the row 630*b* is identified by a row header 640*b* that identifies that the row corresponds to a "Fruit Basket 1" model entity. In this manner, a grid 612*b* can, for example, be used to show collapsed representations of attributes associated with a number of model entities, where each row may correspond to a model entity that may be a parent of, contain, or be otherwise related to the other model entities represented in the row. For example, similar features of a second fruit basket model entity could be represented in a second row, which may be labeled "Fruit Basket 2."

By preserving the header and cell information when forming a grid 612*a* or 612*b*, embodiments of the invention allow the representation to be consistent between both grid representations 610*a*/610*b* and 612*a*/612*b*. Additionally, by retaining each cell representation, embodiments of the invention allow preservation of information such as, for example, identifications of links or paths. For example, cell 614*a* of the grid 610*a* can be represented by the same path name, "[Apple1]$Size$Value", as cell 614*a* of the grid 612*b*. Note, however, that, in embodiments, a grid 610*a* can be associated with a particular model entity type (e.g., [Apple1]) and, therefore, it may be sufficient for the cell 614*a* in the grid 610*a* to be represented by "$Size$Value" within grid 610*a*, whereas, in the grid 612*b*, it may be useful for the cell 614*a* to include "[Apple 1]" as part of its path in grid 612*b*, to indicate the model entity to which the cell relates. The use of relative path names described above simplifies the path based on where the cell is referenced and does not affect the preservation of information; the full path name may still be used to identify the cell and will be consistent between the collapsed and non-collapsed grid representations.

Figure 7:
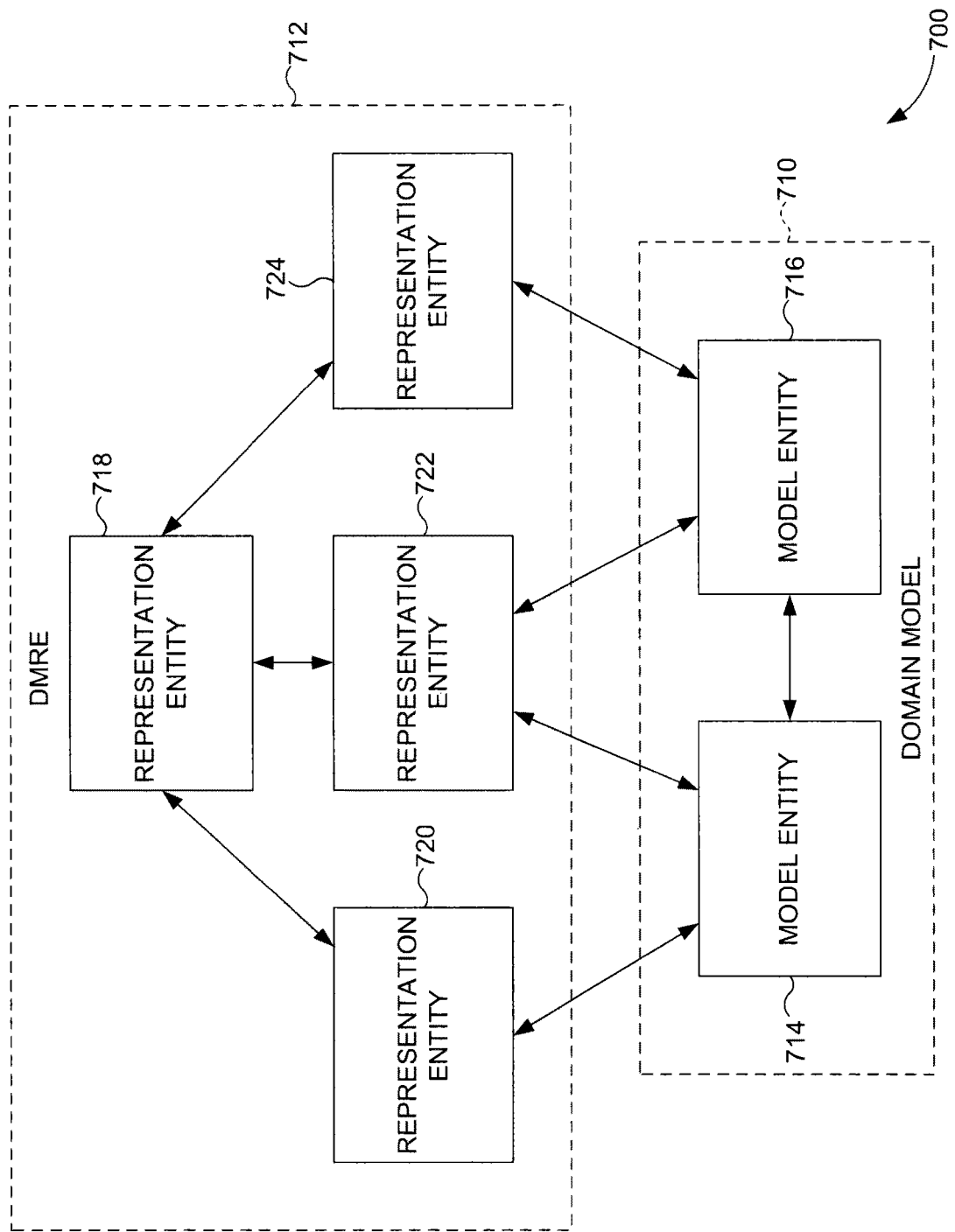
FIG. 7 depicts a portion of an illustrative domain environment in accordance with embodiments of the invention.

FIG. 7 depicts a portion 700 of an illustrative domain environment such as, for example, the illustrative domain environment 100 depicted in FIG. 1. As shown in FIG. 7, a domain model 710 is represented using a domain model representation file (DMRE) 712. The DMRE contains representation entities 718, 720, 722, and 724. For example, in embodiments, the environment can be packaged as an application and, in the application, all of the representation entities 718, 720, 722, and 724 used to produce the application experience can be contained in a DMRE 712. As illustrated, the DMRE 712 can include, for example, a high-level representation entity 718 that interacts with, and/or organizes additional, lower-level representation entities 720, 722, and 724. For instance, in the fruit-basket example, the DMRE 712 can be a "project" that includes all of the representation entities 718, 720, 722, and 724 used in the fruit-basket application. Any one or more of the representation entities 718, 720, 722, and 724 can provide representations of any one or more of the model entities 714 and 716. Additionally, in embodiments, active criteria can be applied throughout the DMRE 712 and can be used, for example, to facilitate configuring various aspects of a representation of the domain model 710.

FIG. 8 is a flow diagram depicting an illustrative method 800 for creating a representation of a domain model in accordance with embodiments of the invention. The illustrative method 800 is just one example of a method that could be performed in accordance with embodiments of the invention and is not intended to imply any particular order among or between various steps herein disclosed (or other steps that may be employed that are not explicitly disclosed in the context of FIG. 8). For instance, in embodiments, additional states may be added after active criteria are added; representational aspects of a cell, such as link and drilldown view definitions may be defined before active criteria are defined; and the like. In embodiments, the domain model and representation (or representations) can be combined to create an application. In embodiments, an application can include application components such as, for example, model entities, model entity attributes, representation entities, representation entity attributes, and the like. The representation of the domain model can include, for example, one or more representation entities. In embodiments, the domain model includes one or more model entities, each of which can include one or more model entity attributes such as, for example, model entity members, properties, methods, events, and the like.

As shown at block 810, the illustrative method 800 includes defining a grid. Defining the grid can include defining cells, defining rows of cells, defining columns of cells, defining higher-order dimensional arrangements of cells, and defining a visual layout of a grid having one or more cells. In embodiments, for example, defining the visual layout can include defining a set of cells each identified by a row and a column. Embodiments of the illustrative method 800 include defining a collapsed representation of the set of cells, where the collapsed representation preserves row and column identifiers for each cell in column headers. At block 812, the illustrative method 800 includes defining one or more states corresponding to a cell. In embodiments, states can also correspond to any number of other application components, as described above. Embodiments of the illustrative method 800 also include defining one or more bindings (block 814). Each binding can bind a cell to a model entity or model entity attribute. Additionally, in embodiments, a binding (and associated states) can be defined such that the binding is active when a particular state is active.

As shown at block 818, the illustrative method 800 includes defining active criteria associated with states. For example, in embodiments, a state corresponding to a cell may define a behavioral attribute that includes at least one of whether the cell is active or inactive, a set of allowed display values associated with a bound value set, whether the cell is read only or read/write, whether the cell is linkable, and validation criteria associated with the cell. In embodiments, an active criterion can be defined that determines the behavioral attribute. At block 820, the illustrative method 800 includes defining a link associated with an application component. In embodiments, defining the representation of the domain model can also include defining outputs, output behaviors, a domain model structure, and any number of other features associated with representing a domain model or portions thereof.

Embodiments of the disclosed subject matter are described in the general context of computer-executable instructions. Computer-executable instructions can include, for example, computer code, machine-useable instructions, and the like such as, for example, program components, capable of being executed by one or more processors associated with a computing device. Generally, program components including routines, programs, model entities, objects, modules, data structures, and the like, refer to code that, when executed, causes a computing device to perform particular tasks (e.g., methods, calculations, and the like) or implement or manipulate various abstract data types. Some or all of the functionality contemplated herein can also be implemented in hardware and/or firmware.

Computer-readable media include both volatile and nonvolatile media, removable and nonremovable media, and contemplate media readable by a database, a processor, a router, and various other networked devices. By way of example, and not limitation, computer-readable media can include computer-storage media, which is media implemented in any method or technology for storing information. Examples of stored information include computer-executable instructions, data structures, program modules, and other data representations. Media examples include, but are not limited to, Random Access Memory (RAM); Read Only Memory (ROM); Electronically Erasable Programmable Read Only Memory (EEPROM); flash memory or other memory technologies; Compact Disc Read-Only Memory (CD-ROM), digital versatile disks (DVDs) or other optical or holographic media; magnetic cassettes, magnetic tape, magnetic disk storage or other magnetic storage devices; data transmissions; or any other medium that can be used to encode information and can be accessed by a computing device such as, for example, quantum state memory, and the like.

Embodiments may be practiced in a variety of system configurations, including handheld devices, general-purpose computers, specialty computing devices, servers, workstations, cloud computing platforms, and the like. Embodiments may also be practiced in distributed computing environments where tasks are performed by a number of computing devices that are linked through a communications network. According to embodiments, a computing device can include any type of computing device suitable for implementing embodiments of the invention. Examples of computing devices include "workstations," "servers," "laptops," "desktops," "tablet computers," "hand-held devices," and the like, all of which are contemplated within the scope of FIG. 1 and reference to various components of the domain environment 100.

In embodiments, a computing device includes a bus that, directly and/or indirectly, couples the following devices: a processor, a memory, an input/output (I/O) port, an I/O component, and a power supply. Any number of additional components, different components, and/or combinations of components can also be included in the computing device. The bus represents what may be one or more busses (such as, for example, an address bus, data bus, or combination thereof). Similarly, in embodiments, the computing device can include a number of processors, a number of memory components, a number of I/O ports, a number of I/O components, and/or a number of power supplies. Additionally any number of these components or combinations thereof can be distributed and/or duplicated across a number of computing devices.

Any number of other various types of embodiments may be contemplated within the ambit of the invention. Accordingly, the scope of the present invention is intended to embrace all such alternatives, modifications, and variations as fall within the scope of the present disclosure, together with all equivalents thereof. While the subject matter of embodiments of the inventions disclosed herein is described with specificity, the description itself is not intended to limit the scope of this patent. Rather, the inventors have contemplated that the claimed subject matter might also be embodied in other ways, to include different steps or features, or combinations of steps or features similar to the ones described in this document, in conjunction with other technologies. Moreover, although the term "block" may be used herein to connote different elements of methods employed, the term should not be interpreted as implying any particular order among or between various steps herein disclosed unless and except when the order of individual steps is explicitly called for.

The following is claimed:

1. A method of using a computing device to provide a representation of at least a portion of a domain model, the domain model including at least one of a model entity and one or more model entity attributes, the method comprising:
   visibly representing the at least one model entity in a representation structure;
   visibly representing the one or more model entity attributes in at least one grid, the at least one grid comprising a plurality of adjacent cells, wherein each of the cells is identified by a row identifier and a column identifier;
   creating, using a processor, a link from a cell in the grid to at least one of the at least one model entity and one of the one or more model entity attributes, wherein the link is represented as a displayed path, and wherein at least a portion of the path comprises at least one of an indication of the at least one model entity, an indication of a row identifier, and an indication of a column identifier;
   visibly changing the location of the at least one model entity within the representation structure; and
   updating the displayed path to reflect the location change of the at least one model entity within the representation structure.

2. The method of claim 1, wherein the one or more model entity attributes include at least one of a model entity state and a model entity behavior; the model entity state comprising at least one of a variable, a definition, a property, a programming method, a function, a relation, and an event; and the model entity behavior comprising at least one of a variable, a definition, a property, a programming method, a function, a relation, and an event.

3. The method of claim 1, wherein the representation structure is at least one of a graph structure and a tree structure.

4. The method of claim 1, wherein the domain model comprises at least one of an analytical domain model, a time-series domain model, a scientific domain model, a financial domain model, and an engineering domain model.

5. One or more non-transitory machine-readable storage media having computer-executable instructions embodied thereon for providing a representation of at least a portion of a domain model, the domain model including at least one of a model entity and one or more model entity attributes, the instructions configured to be executed by a processor to cause the processor to perform a plurality of steps, the plurality of steps comprising:
   visibly representing the at least one model entity in a representation structure;
   visibly representing the one or more model entity attributes in at least one grid, the at least one grid comprising a plurality of adjacent cells, wherein each of the cells is identified by a row identifier and a column identifier;
   creating a link from a cell in the grid to at least one of the at least one model entity and one of the one or more model entity attributes, wherein the link is represented as a displayed path, and wherein at least a portion of the path comprises at least one of an indication of the at least one model entity, an indication of a row identifier, and an indication of a column identifier;

visibly changing the location of the at least one model entity within the representation structure; and updating the displayed path to reflect the location change of the at least one model entity within the representation structure.

6. The media of claim 5, wherein the one or more model entity attributes include at least one of a model entity state and a model entity behavior; the model entity state comprising at least one of a variable, a definition, a property, a programming method, a function, a relation, and an event; and the model entity behavior comprising at least one of a variable, a definition, a property, a programming method, a function, a relation, and an event.

7. The media of claim 5, wherein the representation structure is at least one of a graph structure and a tree structure.

8. The media of claim 5, wherein the domain model comprises at least one of an analytical domain model, a time-series domain model, a scientific domain model, a financial domain model, and an engineering domain model.

* * * * *